US012782781B2

(12) United States Patent
Murakami

(10) Patent No.: US 12,782,781 B2
(45) Date of Patent: Nov. 3, 2026

(54) DRIVING SUBSTRATE AND DISPLAY PANEL

(71) Applicant: Sharp Display Technology Corporation, Kameyama City (JP)

(72) Inventor: Shinzoh Murakami, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 380 days.

(21) Appl. No.: 18/633,421

(22) Filed: Apr. 11, 2024

(65) Prior Publication Data

US 2024/0427202 A1 Dec. 26, 2024

(30) Foreign Application Priority Data

Jun. 23, 2023 (JP) ................................ 2023-103677

(51) Int. Cl.

| | |
|---|---|
| ***G02F 1/1345*** | (2006.01) |
| ***G02F 1/1362*** | (2006.01) |
| ***H10D 86/01*** | (2026.01) |
| ***H10D 86/40*** | (2025.01) |
| ***H10D 86/60*** | (2025.01) |

(52) U.S. Cl.

CPC .... *G02F 1/13454* (2013.01); *G02F 1/136286* (2013.01); *H10D 86/021* (2025.01); *H10D 86/441* (2025.01); *H10D 86/60* (2025.01)

(58) Field of Classification Search

CPC ............. G02F 1/13452; G02F 1/13454; G02F 1/13458; G02F 1/136286; H10D 86/021; H10D 86/441; H10D 86/60

See application file for complete search history.

(56) References Cited

U.S. PATENT DOCUMENTS

2009/0153008 A1* 6/2009 Yanagisawa ........ G02F 1/13458 313/51
2015/0145847 A1* 5/2015 Kim ..................... G09G 3/3688 345/98
2015/0187803 A1* 7/2015 Moh .................. G02F 1/13452 438/23
2015/0255487 A1* 9/2015 Yoshida ................ G02F 1/1345 257/43
2016/0300545 A1* 10/2016 Kim .................... G02F 1/13452
(Continued)

FOREIGN PATENT DOCUMENTS

JP 2009-145849 A 7/2009

*Primary Examiner* — Ryan A Lubit
(74) *Attorney, Agent, or Firm* — ScienBiziP, P.C.

(57) ABSTRACT

A driving substrate of a display panel includes A driving substrate of a display panel, the driving substrate a pixel element, a plurality of terminals, formed by at least one metal layer and placed outside a pixel region in which the pixel element is placed, that are connected separately to each of a plurality of output signal bumps of a driving circuit, and a plurality of output signal wires extending separately from each of the plurality of terminals to the pixel region. The plurality of output signal wires are placed between adjacent two of the plurality of terminals in planar view. The plurality of output signal wires placed between the adjacent two terminals include two or more output signal wires formed by two or more layers. The two or more output signal wires are disposed to at least partially overlap each other in planar view.

8 Claims, 10 Drawing Sheets

(56) References Cited

U.S. PATENT DOCUMENTS

| | | | | |
|---|---|---|---|---|
| 2017/0104008 | A1* | 4/2017 | Takenaka | G02F 1/13452 |
| 2017/0184904 | A1* | 6/2017 | Moh | G02F 1/13452 |
| 2019/0157231 | A1* | 5/2019 | Oh | H10D 86/441 |
| 2019/0285920 | A1* | 9/2019 | Kuroe | G02F 1/1345 |
| 2020/0051940 | A1* | 2/2020 | Kim | G02F 1/13454 |
| 2021/0091162 | A1* | 3/2021 | Kim | G02F 1/13452 |

* cited by examiner

DRIVING SUBSTRATE AND DISPLAY PANEL

BACKGROUND

1. Field

The present disclosure relates to a driving substrate and a display panel.

2. Description of the Related Art

In a liquid crystal panel as an example of a display panel, an active matrix substrate and a counter substrate are placed opposite each other with a liquid crystal sandwiched therebetween, and an image is formed by the liquid crystal controlling the transmittance of light. In the active matrix substrate, a plurality of gate lines and a plurality of source lines are disposed to be orthogonal to each other. In the active matrix substrate, a TFT (thin-film transistor) is placed at a point of intersection of each of the gate lines and each of the source lines. A plurality of terminals are formed outside a display region of the active matrix substrate. A plurality of output signal bumps of a driving circuit are connected separately to each of the plurality of terminals, and signals are supplied from the driving circuit to the gate lines and the source lines.

Japanese Unexamined Patent Application Publication No. 2009-145849 is an example of related art.

An increase in resolution of a screen is accompanied by an increase in the number of output signal bumps of the driving circuit. Further, addition of high-function terminals such as those for use in a touch detection function may cause an increase in the number of output signal bumps. Therefore, the number of terminals that are placed in a driving substrate on which the driving circuit is mounted tends to increase. An increase in the number of output signal bumps is accompanied by reductions in spacing between output signal bumps, entailing reductions in spacing (pitch) between terminals to be connected. Meanwhile, an increase in the number of terminals is accompanied by an increase in the number of output signal wires that extend from the terminals to the display region. Therefore, there is demand for a driving substrate and a display panel in which output signal wires are easily placed.

SUMMARY

According to an aspect of the disclosure, there is provided a driving substrate of a display panel. The driving substrate includes A driving substrate of a display panel, the driving substrate a pixel element, a plurality of terminals, formed by at least one metal layer and placed outside a pixel region in which the pixel element is placed, that are connected separately to each of a plurality of output signal bumps of a driving circuit, and a plurality of output signal wires extending separately from each of the plurality of terminals to the pixel region. The plurality of output signal wires are placed between adjacent two of the plurality of terminals in planar view. The plurality of output signal wires placed between the adjacent two terminals include two or more output signal wires formed by two or more layers. The two or more output signal wires are disposed to at least partially overlap each other in planar view.

DESCRIPTION OF THE EMBODIMENTS

Figure 1:
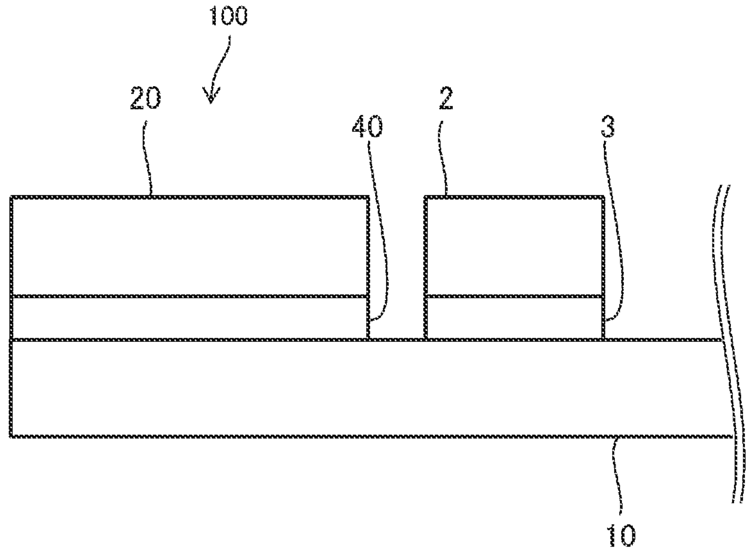
FIG. 1 is a schematic view of a configuration of a display panel according to an embodiment.

1. Brief Overview of Driving Substrate and Display Panel (1) A driving substrate according to an embodiment is a driving substrate of a display panel. The driving substrate includes A driving substrate of a display panel, the driving substrate a pixel element, a plurality of terminals, formed by at least one metal layer and placed outside a pixel region in which the pixel element is placed, that are connected separately to each of a plurality of output signal bumps of a driving circuit, and a plurality of output signal wires extending separately from each of the plurality of terminals to the pixel region. The plurality of output signal wires are placed between adjacent two of the plurality of terminals in planar view. The plurality of output signal wires placed between the adjacent two terminals include two or more output signal wires formed by two or more layers. The two or more output signal wires are disposed to at least partially overlap each other in planar view.

This makes it possible to place the plurality of wires in a shorter distance than in a case where the two or more output signal wires are placed without an overlap. This results in making it possible to, even with a reduction in the spacing between terminals adjacent to each other in planar view, secure the number of wires that are placed between these terminals without an overlap. This makes it possible to place the terminals in a larger number of rows while securing ease of placement of the wires. This makes it possible to mount, on the driving substrate, a high-function driving circuit having a large number of bumps. This results in making it possible to achieve higher resolution and higher functionality without decreases in operation and reliability of the display panel including the driving substrate.

(2) In the driving substrate according to (1), a display region may include a plurality of gate lines and a plurality of source lines disposed to intersect each other in planar view. The pixel element may be placed at a point of intersection of each of the gate lines and each of the source lines, and the output signal wires may separately connect each of the terminals to any of the plurality of gate lines and the plurality of source lines. That is, the driving substrate can be applied to an active matrix substrate.

(3) In the driving substrate according to (2), the two or more layers may include a gate layer by which the gate lines are formed and a source layer by which the source lines are formed. This makes it possible to form the wires in a step that is identical to the formation of the gate lines or the source lines.

(4) In the driving substrate according to any of (1) to (3), the two or more layers may include a layer by which the terminals are formed, and the two or more output signal wires formed by the two or more layers may include a first output signal wire placed adjacent to the terminals in planar view. The first output signal wire may be formed by a layer different from the layer by which the terminals are formed. This makes it possible to make the spacing between a terminal and a wire in planar view smaller than a patternable distance in the layer by which the terminal is formed. Further, even with a reduction in the spacing between terminals adjacent to each other in planar view, the spacings between terminals and wires adjacent to the terminals in an identical layer can be secured. This makes it possible to achieve both ease of patterning and ease of placement of the wires.

(5) In the driving substrate according to (4), the two or more output signal wires formed by the two or more layers may further include a second output signal wire placed adjacent to the terminals in the layer by which the terminals are formed, and the second output signal wire may be disposed to at least partially overlap the first output signal wire in planar view. This makes it possible to, while securing the spacings between terminals formed by an identical layer and wires adjacent to the terminals, place a plurality of wires in a shorter distance between terminals adjacent to each other in planar view.

(6) In the driving substrate according to any of (1) to (5), the two or more layers may include a first layer different from a layer by which the terminals are formed, and the terminals and the output signal wires formed by the first layer may be connected to each other via contact holes provided in communication between the layer by which the terminals are formed and the first layer. This makes it possible to electrically connect terminals formed by the first layer to the wires.

(7) The driving substrate according to any of (1) to (6) may further include an insulating film disposed to cover a layer by which the terminals are formed. The terminals may be connected via contact holes provided in the insulating films to electrodes that are connected to the output signal bumps. This makes it possible to electrically connect the terminals to the output signal bumps.

(8) A display panel according to an embodiment includes the driving substrate according to any of (1) to (7). Including the driving substrate according to any of (1) to (7) makes it possible to mount, on the driving substrate, a high-function driving circuit having a large number of bumps. This results in making it possible to achieve higher resolution and higher functionality without decreases in operation and reliability of the display panel including the driving substrate.

2. Examples of Driving Substrate and Display Panel

First Embodiment

FIG. 1 is a schematic view of a configuration of a display panel 100 according to the present embodiment. The display panel 100 is for example a liquid crystal panel. The display panel 100 includes an active matrix substrate 10 serving as an example of a driving substrate, a liquid crystal panel 40 located at a higher layer than the active matrix substrate 10, and a counter substrate 20 placed opposite the active matrix substrate 10 with the liquid crystal layer 40 sandwiched therebetween. The counter substrate 20 includes a color filter (not illustrated) and forms a color image.

Figure 2:
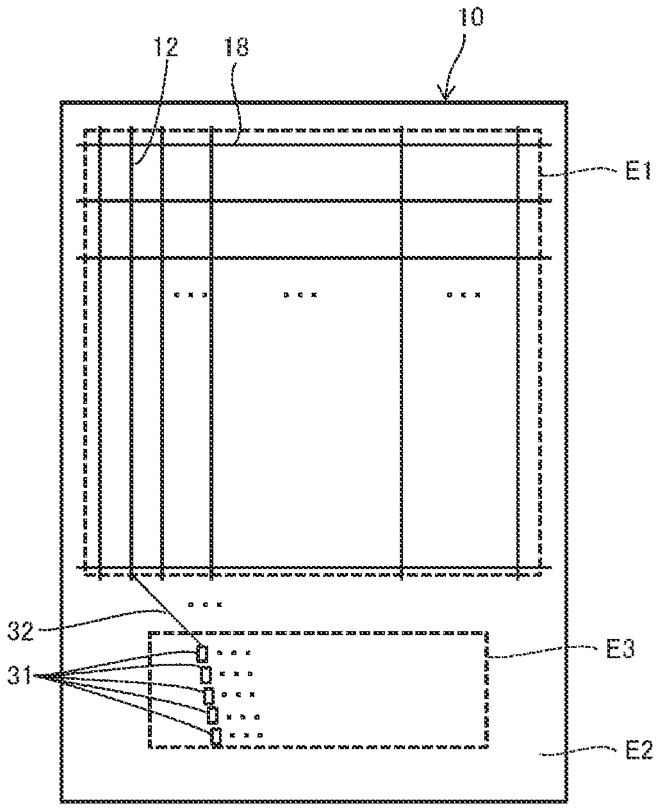
FIG. 2 is a schematic plan view of an active matrix substrate included in the display panel of FIG. 1.

FIG. 2 is a schematic plan view of the active matrix substrate 10. The active matrix substrate 10 includes a plurality of gate lines 18 and a plurality of source lines 12. The plurality of gate lines 18 and the plurality of source lines 12 intersect each other in planar view and are arranged in gridlike fashion. At a point of intersection of each of the plurality of gate lines 18 and each of the plurality of source lines 12, a pixel element is placed. The pixel element is a thin-film transistor 51 (not illustrated in FIG. 2; see FIG. 3).

Figure 3:
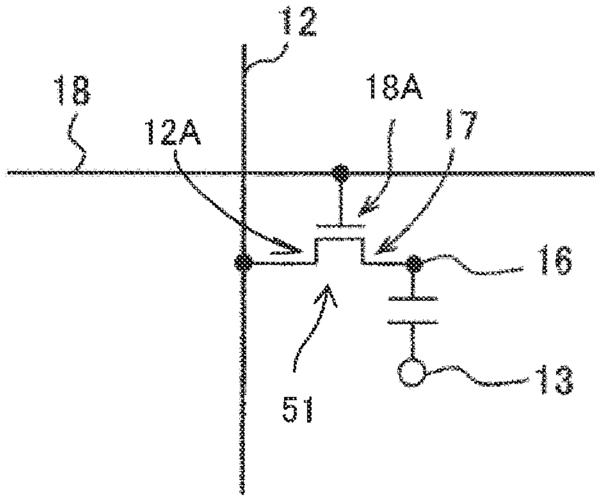
FIG. 3 is an equivalent circuit diagram for explaining connections between a thin-film transistor and gate and source lines in the active matrix substrate.

FIG. 3 is an equivalent circuit diagram for explaining connections between the thin-film transistor 51 and the gate and source lines 18 and 12 in the active matrix substrate 10. The thin-film transistor 51 is composed of a semiconductor layer 50, a source electrode 12A, a gate electrode 18A, a drain electrode 17, or other components. The gate electrode 18A of the thin-film transistor 51 is connected to the gate line 18. The source electrode 12A is connected to the source line 12. The drain electrode 17 is connected to a pixel electrode 16. A plurality of the pixel electrodes 16 are placed in a pixel region E1.

The pixel region E1 is formed by a region in which the active matrix substrate 10 and the counter substrate 20 are placed opposite each other. In a region E2 outside the pixel region E1, a driving circuit (IC: integrated circuit) 2 for driving the display panel 100 is placed via an anisotropic conductive film 3 containing conducting particles.

Figure 4:
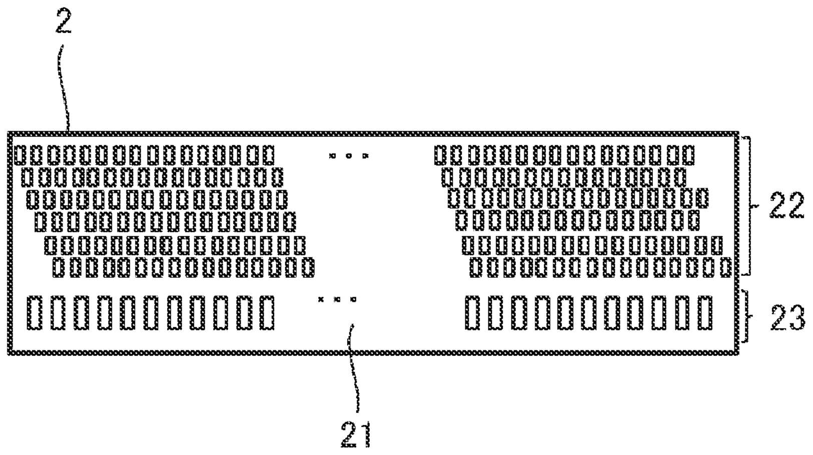
FIG. 4 is a schematic view representing an example of a driving circuit that is mounted on the active matrix substrate.

FIG. 4 is a schematic view representing an example of the driving IC 2. The driving IC 2 includes a plurality of output signal bumps 22 placed on top of a substrate 21 and input signal bumps 23. The bumps 22 are placed in a staggered arrangement on top of the substrate 21 according to resolution. In the example shown in FIG. 4, the bumps 22 are arranged in six rows in a longitudinal direction. An upper side of FIG. 4 is a side nearer to a region of the active matrix substrate 10 in which the counter substrate 20 is placed, and a lower side of FIG. 4 is a side farther from the region.

The region E2 of the active matrix substrate 10 includes a terminal region E3 (FIG. 2). In the terminal region E3, a plurality of terminals 31 are placed. The plurality of terminals 31 are connected separately to each of the plurality of bumps 22 of the driving IC 2 via the anisotropic conductive film 3. The plurality of terminals 31 are arranged in a matrix in the terminal region E3 in conformance with the arrangement of the bumps 22. Although, in FIG. 2 or other drawings, the terminals 31 are represented by rectangles, the shapes of the terminals 31 are not limited to rectangles.

Figure 6:
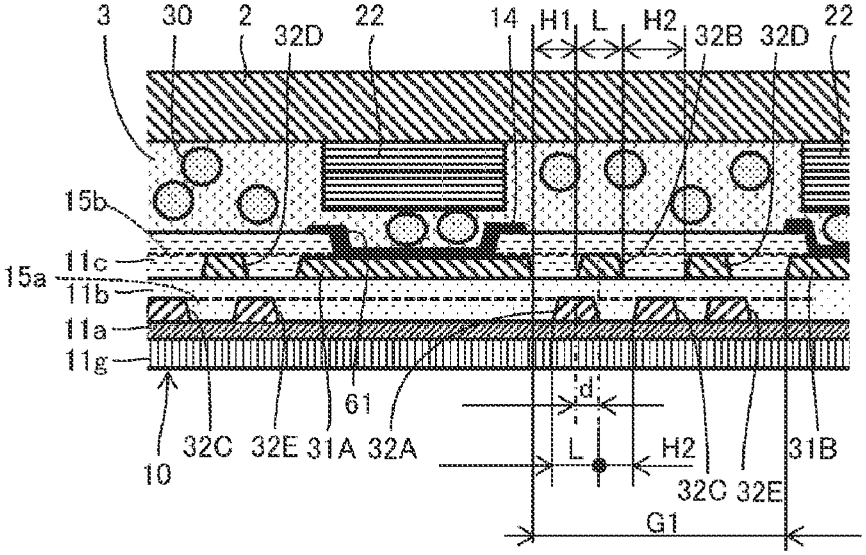
FIG. 6 is a schematic cross-sectional view of the portion P as taken along line A-A in FIG. 5.

The anisotropic conductive film 3 is a resin film containing conducting particles 30 (see FIG. 6 or other drawings). The conducting particles 30 are dispersed in the resin film. When the driving IC 2 is press-bonded to the active matrix substrate 10, the bumps 22 and the terminals 31 are electrically connected to each other via the conducting particles 30. In a direction in which the driving IC 2 is not press-bonded to the active matrix substrate 10, the bumps 22 and the terminals 31 are not electrically connected to each other, as the conducting particles 30 are apart from one another.

In the terminal region E3, an output signal wire (hereinafter abbreviated as "wire") 32 extending from the plurality of terminals 31 to the pixel region E1. A plurality of the wires 32 are each connected to any of the plurality of gate lines 18 and the plurality of source lines 12. This allows the plurality of terminals 31 to supply signals to any of the plurality of gate lines 18 and the plurality of source lines 12 via the wire 32.

Figure 5:
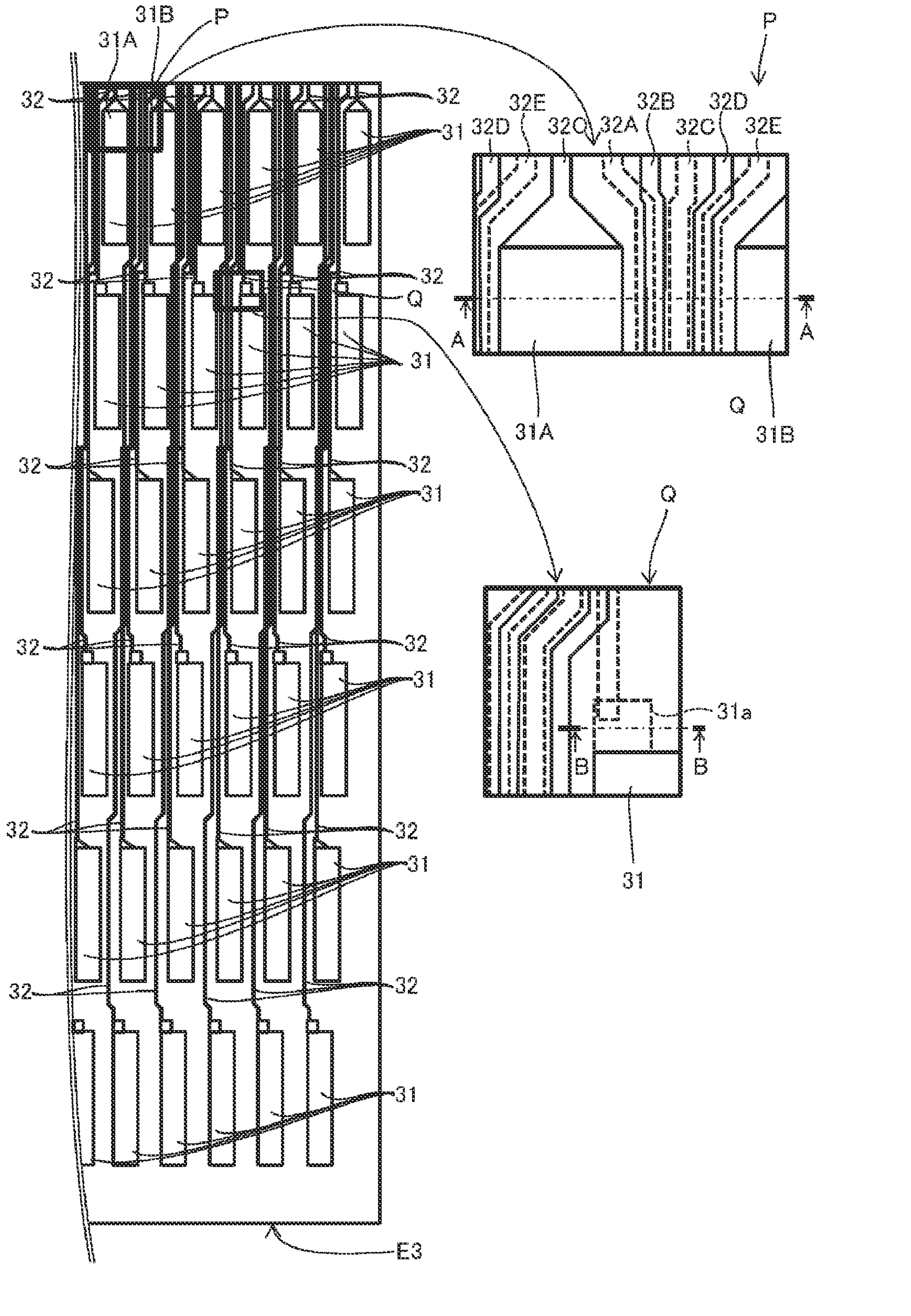
FIG. 5 illustrates a schematic plan view of a terminal region of the active matrix substrate according to the first embodiment and schematic enlarged views of portions P and Q in the plan view.
Figure 7:
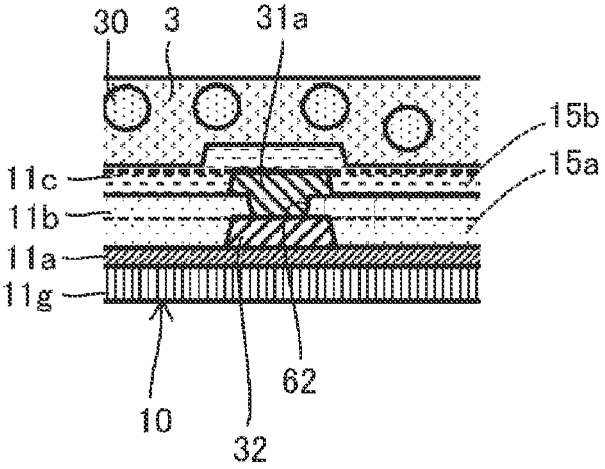
FIG. 7 is a schematic cross-sectional view of the portion Q as taken along line B-B in FIG. 5.

FIG. 5 illustrates a schematic plan view of the terminal region E3 of the active matrix substrate 10 according to the first embodiment and schematic enlarged views of portions P and Q in the plan view. FIG. 6 is a schematic cross-sectional view of the portion P as taken along line A-A. FIG. 7 is a schematic cross-sectional view of the portion Q as taken along line B-B. The region shown in FIG. 5 is located below the pixel region E1.

As shown in FIG. 5, in the terminal region E3, the terminals 31 are formed in a six-row staggered arrangement at spacings in conformance with the bumps 22 of the driving IC 2. The following description assumes that the transverse array of terminals 31 closest to the pixel region E1 is the first row, followed by the second, third, . . . , and sixth rows in a direction away from the pixel region E1.

In the terminal region E3, a plurality of the wires 32 are placed between terminals 31. Five wires 32 are placed between terminals 31 of the first row in planar view.

Specifically, the portion P includes terminals 31A and 31B of the first row, and between the terminals 31A and 31B, five wires, namely wires 32A, 32B, 32C, 32D, and 32E, are placed in planar view. In planar view, the wires 32A, 32B, 32C, 32D, and 32E are arranged in this order between the terminals 31A and 31B.

As shown in FIG. 6, the terminal region E3 of the active matrix substrate 10 includes a glass substrate 11g, a first insulating film 11a, a first metal layer 15a, a second insulating film 11b, a second metal layer 15b, and a third insulating film 11c that are stacked in this order in a thickness direction from a side opposite to the driving IC 2. In the following description, the term "upper" means an upper direction in FIGS. 6 and 7, and means a side of the active matrix substrate 10 that faces the driving IC 2. Further, the term "lower" means a side opposite to the upper direction in FIGS. 6 and 7, and means a side of the active matrix substrate 10 that faces the glass substrate 11g.

The first metal layer 15a is placed over the first insulating film 11a, which covers the glass substrate 11g. The first metal layer 15a is made of a metal film (gate metal). The first metal layer 15a forms the gate lines 18 and the gate electrode 18A. The second insulating film 11b is placed at a higher layer than the first insulating film 11a so as to cover the first metal layer 15a.

The second metal layer 15b is placed over the first insulating film 11a. The second metal layer 15b is made of a metal film (source metal). The second metal layer 15b forms the source lines 12, the source electrode 12A, and the drain electrode 17.

The third insulating film 11c is placed at a higher layer than the second insulating film 11b so as to cover the second metal layer 15b. The first insulating film 11a, the second insulating film 11b, and the third insulating film 11c are made of inorganic insulating films. This causes the first metal layer 15a and the second metal layer 15b to be insulated from each other.

The terminals 31 are formed by either the first metal layer 15a or the second metal layer 15b. This makes it possible to form the terminals 31 in a step that is identical to the formation of the gate lines 18 and the gate electrode 18A or the source lines 12, the source electrode 12A, and the drain electrode 17. As one example, the terminals 31 are formed by a single metal layer. The terminals 31 are formed, for example, by the second metal layer 15b.

The third insulating film 11c has contact holes (openings) 61 provided above the terminals 31. This causes the terminals 31 to be exposed upward. Transparent electrodes 14 are disposed to cover parts of a layer higher than the third insulating film 11c and the contact holes 61. The transparent electrodes 14 are made of a transparent conductive film, e.g. ITO (indium tin oxide). This brings the transparent electrodes 14 into contact with the terminals 31 thus exposed. Therefore, the terminals 31 are electrically connected to the transparent electrodes 14 via the contact holes 61.

The plurality of wires 32 are each formed by either the first metal layer 15a or the second metal layer 15b. The wires 32A, 32B, 32C, 32D, and 32E, which are placed between the terminals 31A and 31B in planar view, include two or more wires formed by two or more metal layers.

In particular, the wire 32A, which is adjacent to the terminal 31A in planar view, and the wire 32E, which is adjacent to the terminal 31B in planar view, are formed by the first metal layer 15a, which is different from the metal layer by which the terminals 31A and 31B are formed. The wire 32B, which is adjacent to the wire 32A in planar view, and the wire 32D, which is adjacent to the wire 32E in planar view, are formed by the second metal layer 15b, which is different from the metal layer by which the wires 32A and 32E are formed and identical to the metal layer by which the terminal 31A is formed. The wire 32C, which is adjacent to the wires 32B and 32D in planar view, is formed by the first metal layer 15a, which is different from the metal layer by which the wires 32B and 32D are formed. That is, the terminal 31A, the wires 32A, 32B, 32C, 32D, and 32E, and the terminal 31B are formed by alternately different metal layers.

Two wires 32 adjacent to each other in planar view and formed by different metal layers are disposed to at least partially overlap each other in planar view. The wires 32B and 32A, which are adjacent to each other in planar view, are placed so that the wire 32B overlaps the wire 32A by a length d. The length d is not limited to a particular length and, for example, is half of a width L of each of the wires 32A and 32B (d=L/2). The length d may be a length other than the length of half of the width L.

The terminals 31A and 31B are placed at a spacing G1 from each other in the first metal layer 15a. The wire 32B is placed in a position at a patternable distance H1 from the adjacent terminal 31A in the second metal layer 15b. Each of the wires 32 is formed at a spacing H2 from an adjacent wire 32 in a corresponding one of the metal layers. The spacing H2 is greater than or equal to the patternable distance H1. Note that patternable line widths and spaces may vary according to the respective materials of the first metal layer 15a (gate metal) and the second metal layer 15b (source metal). Although, in FIG. 6, the distances H1, H2, and L are shown as distances common to the first metal layer 15*a* and the second metal layer 15*b*, the distances H1, H2, and L may vary between the first metal layer 15*a* and the second metal layer 15*b*.

The terminals 31 of the first to sixth rows are connected to wires 32 formed by alternately different metal layers. In the example shown in FIG. 5, the terminals 31 of the first, third, and fifth rows are connected to wires 32 formed by the second metal layer 15*b*, which is identical to the metal layer by which those terminals 31 are formed. The terminals 31 of the second, fourth, and sixth rows are connected to wires 32 formed by the first metal layer 15*a*, which is different from the metal layer by which those terminals 31 are formed. Therefore, the terminals 31 of the second, fourth, and sixth rows have connectors 31*a*.

The second insulating film 11*b* has contact holes (openings) 62 in positions on the wires 32 connected to the connectors 31*a* of the terminals 31 of the second, fourth, and sixth rows, with the positions corresponding to the connectors 31*a* and covering the upper sides of the wires 32 (FIG. 7). The contact holes 62 are provided in communication between the second metal layer 15*b*, by which the terminals 31 are formed, and the first metal layer 15*a*, by which the wires 32 connected to the connectors 31*a* are formed. This causes the wires 32 to be partially exposed upward. The connectors 31*a* are formed by the second metal layer 15*b* to cover parts of the second insulating film 11*b* and the contact holes 62. This causes the connectors 31*a* to make contact with parts of the wires 32 thus exposed and be electrically connected to the wires 32. In other words, the terminals 31 of the second, fourth, and sixth rows and the wires 32 formed by the first metal layer 15*a* are connected to each other via the contact holes 62.

Figure 8:
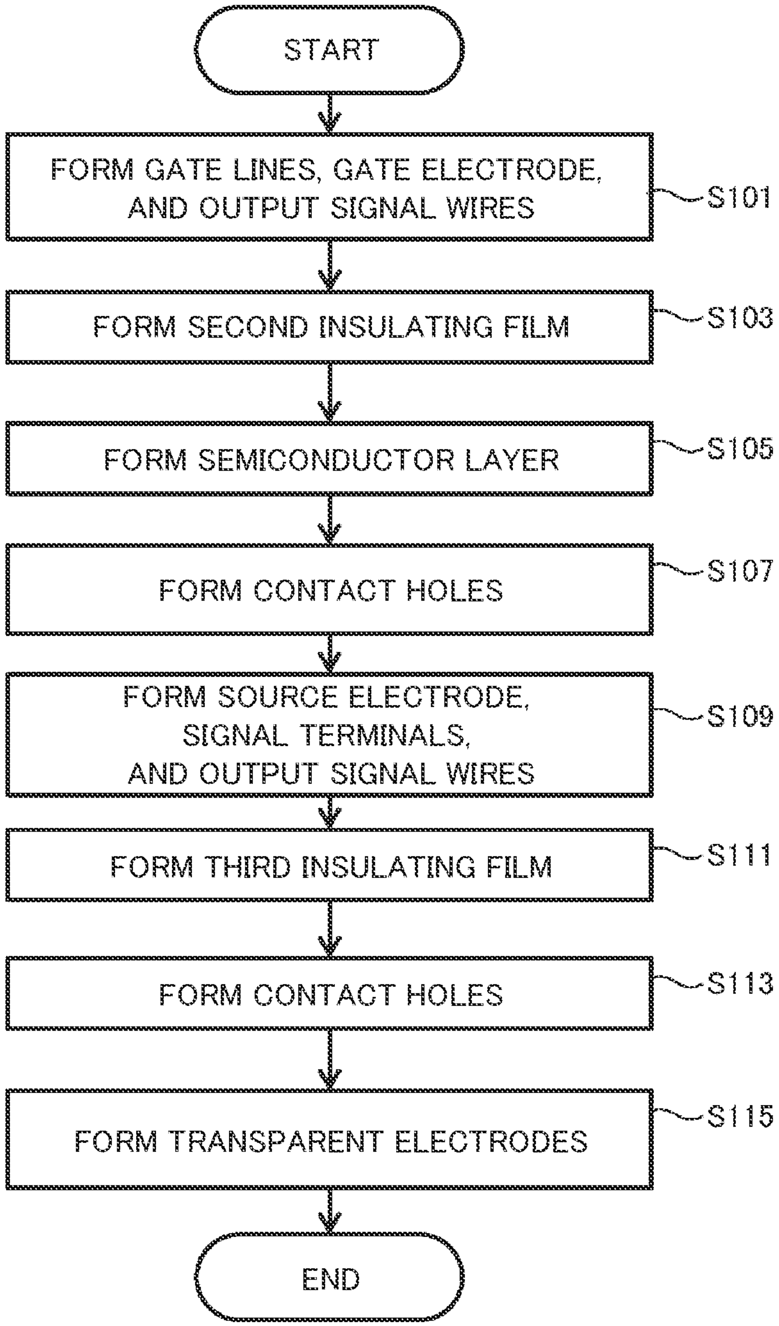
FIG. 8 is a flow chart representing an example of a sequence of some actions making up a method for manufacturing the active matrix substrate according to the first embodiment.

FIG. 8 is a flow chart representing an example of a sequence of some actions making up a method for manufacturing the active matrix substrate 10 according to the first embodiment. First, the gate lines 18 and the gate electrode 18A are formed by the first metal layer 15*a* over the glass substrate 11*g* with the first insulating film 11*a* interposed therebetween, and the wires 32 are formed (step S101). In step S101, the wires 32A, 32C, and 32E of FIG. 6 are formed.

The second insulating film 11*b* is formed by an inorganic insulating film so as to cover the gate lines 18, the gate electrode 18A, and the wires 32 thus formed (step S103). A semiconductor layer (not illustrated) is formed at a higher layer than the second insulating film 11*b* thus formed (step S105).

The contact holes 62 are formed in the second insulating film 11*b* so as to be in positions on the wires 32 connected to the connectors 31*a* of the terminals 31 formed by the second metal layer 15*b*, with the positions corresponding to the connectors 31*a* (step S107). In particular, in step S107, the openings are formed in the step of patterning the second insulating film 11*b* in step S103.

The source lines 12, the source electrode 12A, and the drain electrode 17 are formed by the second metal layer 15*b* at a higher layer than the second insulating film 11*b* thus formed, and the terminals 31 and the wires 32 are formed (step S109). In step S109, the wires 32B and 32D of FIG. 6 are formed. Further, the connectors 31*a* are formed by the second metal layer 15*b* being patterned so as to cover the contact holes 62 formed in step S107. This causes the connectors 31*a* to be connected to the wires 32. Although the foregoing assumes that the source lines 12 are formed by the same material and at the same time as the source electrode 12A and the drain electrode 17, they may be prepared by different materials and in multiple steps.

The third insulating film 11*c* is formed by an inorganic insulating film so as to cover the source lines 12, the source electrode 12A, the drain electrode 17, the terminals 31, and the wires 32 thus formed (step S111). The contact holes 61 are formed in the third insulating film 11*c* thus formed and above the terminals 31 (step S113). In particular, in step S113, openings are formed in the step of patterning the third insulating film 11*c* in step S111.

The transparent electrodes 14 are formed by a transparent conductive film so as to cover the contact holes 61 at a higher layer than parts of the third insulating film 11*c* thus formed (step S115). This causes the transparent electrodes 14 to be connected to the terminals 31.

The active matrix substrate 10 manufactured by the manufacturing method including the foregoing steps are combined with the counter substrate 20 with the liquid crystal layer 40 sandwiched therebetween and combined with the driving IC 2 with the anisotropic conductive film 3 sandwiched therebetween, whereby the display panel 100 is completed.

In the active matrix substrate 10 according to the first embodiment, the plurality of wires 32A, 32B, 32C, 32D, and 32E, which are placed between the adjacent terminals 31A and 31B, are formed by alternately different metal layers. In so doing, the wires 32A and 32B, which are adjacent to each other in planar view, are disposed to overlap each other by the distance d in planar view. This makes it possible to place the plurality of wires 32A, 32B, 32C, 32D, and 32E in a shorter distance than in a case where the wires 32A and 32B are placed without an overlap.

This results in making it possible to, even with a reduction in the spacing G1 between the terminals 31A and 31B, which are adjacent to each other in planar view, secure the number of wires that are placed between the terminals 31A and 31B without an overlap. This makes it possible to place the terminals 31 in a larger number of rows while securing ease of placement of the wires 32 without reducing the widths of the terminals 31. This makes it possible to mount, on the active matrix substrate 10 according to the present embodiment, a high-function driving IC 2 having a large number of bumps 22. This results in making it possible to achieve higher resolution and higher functionality without decreases in operation and reliability of the display panel 100.

In the active matrix substrate 10 according to the first embodiment, furthermore, the wire 32A, which is adjacent to the terminal 31A in planar view, is formed by a metal layer (first metal layer 15*a*) that is different from a metal layer (second metal layer 15*b*) by which the terminal 31A is formed. This makes it possible to make the spacing between the terminal 31A and the wire 32A in planar view smaller than the patternable distance H1 in the second metal layer 15*b*. Further, even with a reduction in the spacing G1 between the terminals 31A and 31B, the spacings between the terminals 31A and 31B and the wires 32B and 32D, which are adjacent to the terminals 31A and 31B in an identical metal layer, can be secured. This makes it possible to achieve both ease of patterning and ease of placement of the wires 32.

Reductions in the spacing G1 between terminals 31 due to an increase in the number of terminals 31 makes the driving IC 2 tend to be misaligned with the terminals 31 when the driving IC 2 is fitted. A misalignment of the driving IC 2 may cause the bumps 22 to protrude from the terminals 31 to make contact with the wires 32B and 32D, which are adjacent to the terminals 31A and 31B in the second metal layer 15*b*. If the third insulating film 11*c* is thin or there is a crack in part of the third insulating film 11*c*, there is a risk that the bumps 22 and the wires 32B and 32D may become short-circuited.

In this respect, in the active matrix substrate 10 according to the present embodiment, the spacings between the terminals 31A and 31B and the wires 32B and 32D are secured. This increases the distances from fitted bumps 22 to the wires 32B and 32D. This results in making it possible to stop the bumps 22 and the wires 32B and 32D from becoming short-circuited even in a case where the bumps 22 are misaligned with the terminals 31A and 31B.

In the active matrix substrate 10 according to the present embodiment, the wires 32A and 32E, which are adjacent to the terminal 31A, are disposed not to overlap the terminal 31A in planar view. This makes it possible to view the terminal region E3 in a thickness direction from the glass substrate 11*g* after fitting the driving IC 2 to the active matrix substrate 10. This makes it possible to bring the conducting particles 30 into a connecting condition by conducting a bond mark inspection.

Second Embodiment

Figure 9:
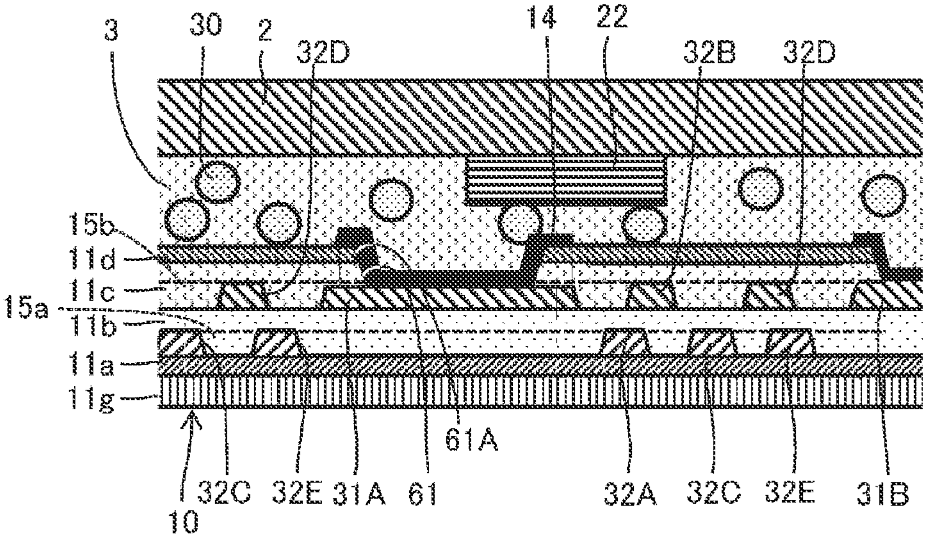
FIG. 9 is a schematic cross-sectional view of a portion P of a terminal region of an active matrix substrate according to a second embodiment as taken along line A-A in FIG. 5.

FIG. 9 is a schematic cross-sectional view of a portion P of a terminal region E3 of an active matrix substrate 10 according to a second embodiment as taken along line A-A. A point of difference from the schematic cross-sectional view (FIG. 6) of the portion P of the terminal region E3 of the active matrix substrate 10 according to the first embodiment as taken along line A-A lies in further including a fourth insulating film 11*d*.

In the active matrix substrate 10 according to the second embodiment, the fourth insulating film 11*d* is placed over the third insulating film 11*c*. Together with the contact holes 61 provided in the third insulating film 11*c* and above the terminals 31, contact holes 61A are provided in the fourth insulating film 11*d* and above the terminals 31. The contact holes 61 and the contact holes 61A communicate with each other. Transparent electrodes 14 are disposed to cover parts of a layer higher than the fourth insulating film 11*d*, the contact holes 61, and the contact holes 61A. This brings the transparent electrodes 14 into contact with the terminals 31 thus exposed. Therefore, the terminals 31 are electrically connected to the transparent electrodes 14 via the contact holes 61 and the contact holes 61A.

In the active matrix substrate 10 according to the second embodiment, which further includes the fourth insulating film 11*d*, an insulating film at a higher layer than adjacent wires 32 is thick. Therefore, even if the third insulating film 11*c* is thin or there is a crack in part of the third insulating film 11*c*, the bumps 22 and the wires 32 are stopped from becoming short-circuited.

Third Embodiment

Figure 10:
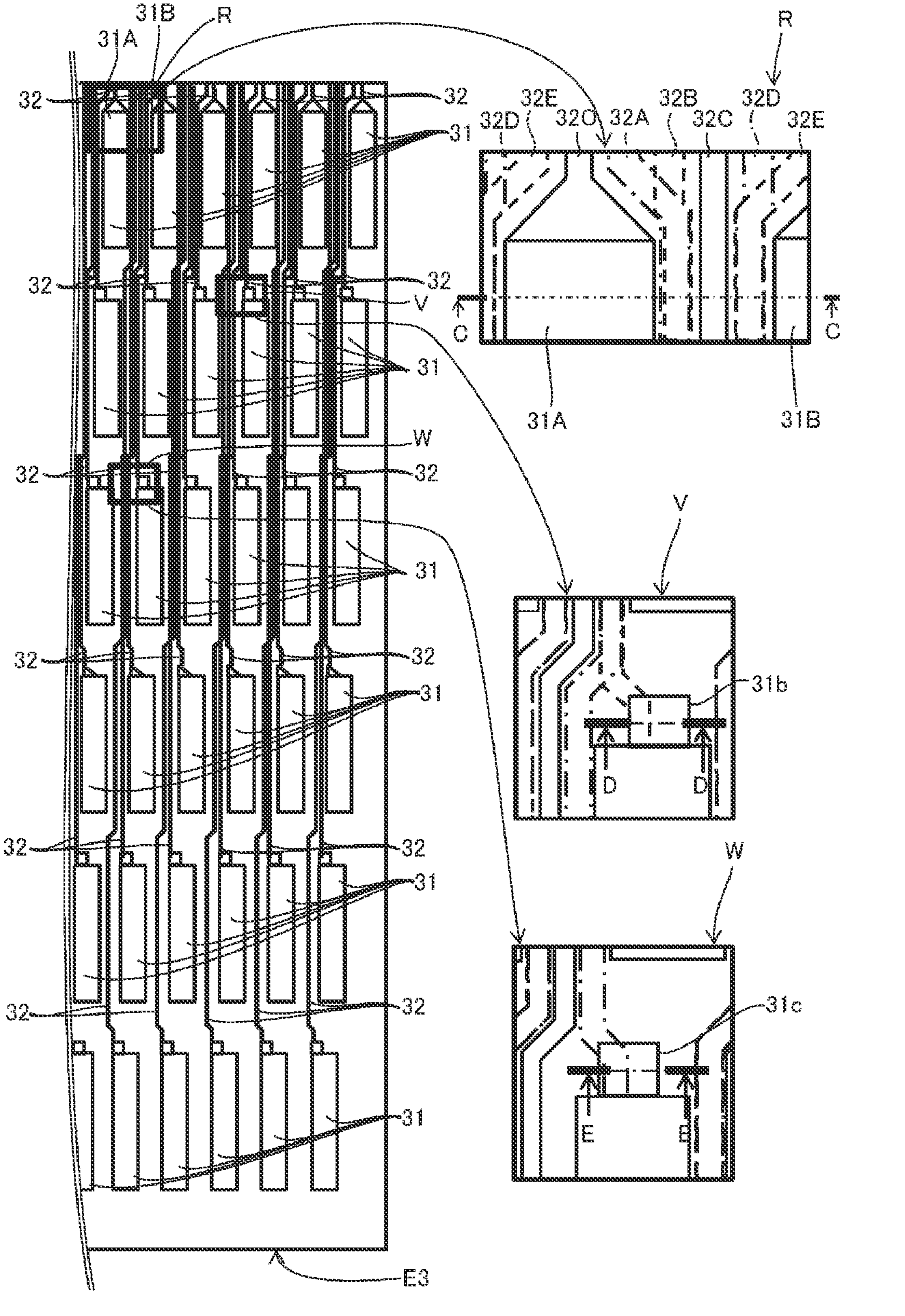
FIG. 10 illustrates a schematic plan view of a terminal region of an active matrix substrate according to a third embodiment and schematic enlarged views of portions R, V, and W in the plan view.
Figure 11:
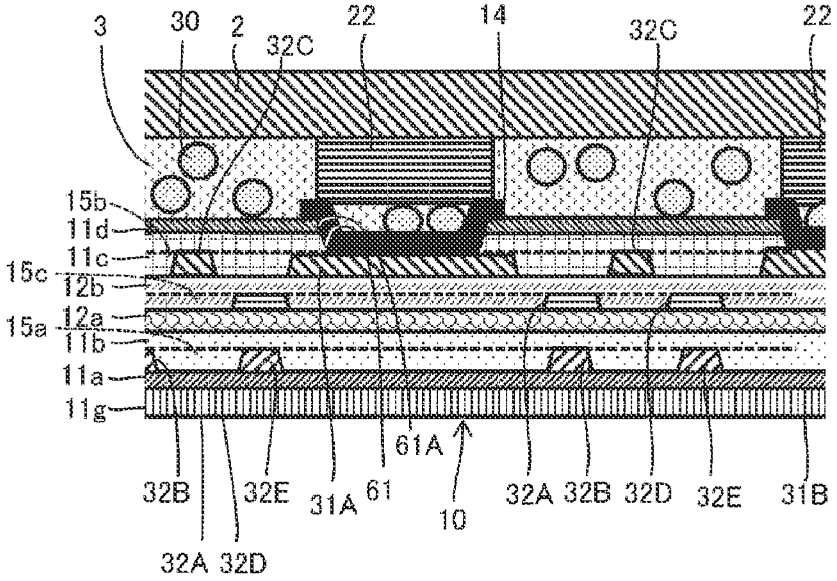
FIG. 11 is a schematic cross-sectional view of the portion R as taken along line C-C in FIG. 10.
Figure 12:
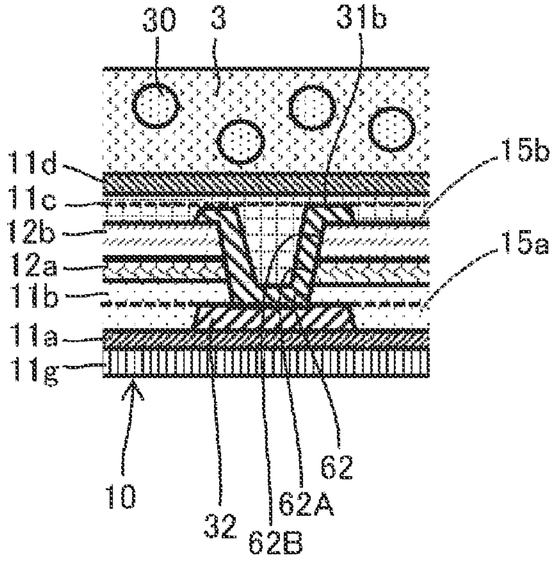
FIG. 12 is a schematic cross-sectional view of the portion V as taken along line D-D in FIG. 10.
Figure 13:
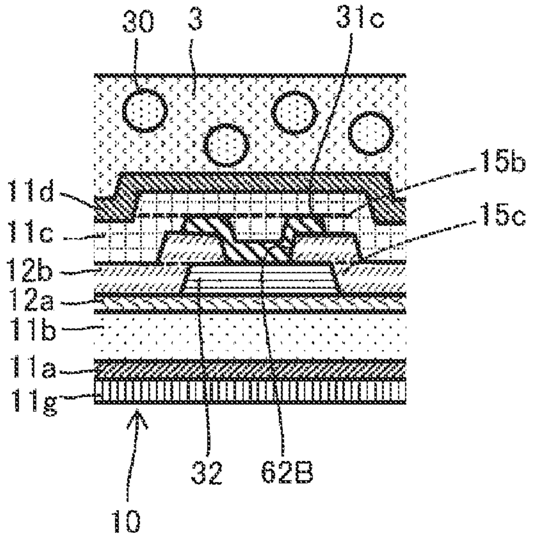
FIG. 13 is a schematic cross-sectional view of the portion W as taken along line E-E in FIG. 10.

FIG. 10 illustrates a schematic plan view of a terminal region E3 of an active matrix substrate 10 according to a third embodiment and schematic enlarged views of portions R, V, and W in the plan view. FIG. 11 is a schematic cross-sectional view of the portion R as taken along line C-C. FIG. 12 is a schematic cross-sectional view of the portion V as taken along line D-D. FIG. 13 is a schematic cross-sectional view of the portion W as taken along line E-E. The region shown in FIG. 10 is located below the pixel region E1.

The active matrix substrate 10 according to the third embodiment differs from the active matrix substrate 10 according to the second embodiment (FIG. 6) in that the active matrix substrate 10 according to the third embodiment includes a third metal layer 15*c*, a fifth insulating film 12*a*, and a sixth insulating film 12*b*.

The fifth insulating film 12*a* is placed at a higher layer than the second insulating film 11*b*, and the third metal layer 15*c* is placed over the fifth insulating film 12*a*. The sixth insulating film 12*b* is placed at a higher layer than the fifth insulating film 12*a* so as to cover the third metal layer 15*c*. The second metal layer 15*b* is placed over the sixth insulating film 12*b*, and the third insulating film 11*c* is placed at a higher layer than the sixth insulating film 12*b* so as to cover the second metal layer 15*b*.

The terminals 31 are formed by the second metal layer 15*b*. The plurality of wires 32 are each formed by any of the first to third metal layers 15*a* to 15*c*. In particular, the wire 32A, which is adjacent to the terminal 31A in planar view, is formed by the third metal layer 15*c*, which is different from the metal layer by which the terminal 31A is formed. The wire 32B, which is adjacent to the wire 32A in planar view, is formed by the first metal layer 15*a*, which is different from the metal layer by which the wire 32A is formed.

The wire 32C, which is adjacent to the wire 32B in planar view, is formed by the second metal layer 15*b*, which is different from the metal layer by which the wire 32B is formed and identical to the metal layer by which the terminal 31A is formed. The wire 32C is placed in a position at a spacing greater than or equal to the patternable distance H1 from the terminal 31A in the second metal layer 15*b*.

The wire 32D, which is adjacent to the wire 32C in planar view, is formed by the third metal layer 15*c*, which is different from the metal layer by which the wire 32C is formed and identical to the metal layer by which the wire 32A is formed. The wire 32D is placed in a position at a spacing greater than or equal to the patternable distance H1 from the wire 32A in the third metal layer 15*c*.

The wire 32E, which is adjacent to the wire 32D in planar view, is formed by the first metal layer 15*a*, which is different from the metal layer by which the wire 32D is formed and identical to the metal layer by which the wire 32B is formed. The wire 32E is placed in a position at a spacing greater than or equal to the patternable distance H1 from the wire 32B in the first metal layer 15*a*.

That is, the terminal 31A, the wires 32A, 32B, 32C, 32D, and 32E, and the terminal 31B are formed by different metal layers in the order of the first to third metal layers 15*a* to 15*c* and are each placed in a position at a spacing greater than or equal to the patternable distance H1 from the adjacent wire in the metal layer by which it is formed. Note that patternable line widths and spaces may vary according to the respective materials of the first to third metal layers 15*a* to 15*c*. Therefore, the patternable distance H1 may vary among the first to third metal layers 15*a* to 15*c*.

In the example shown in FIG. 10, the terminals 31 of the first and fourth rows are connected to wires 32 formed by the second metal layer 15*b*, which is identical to the metal layer by which those terminals 31 are formed. The terminals 31 of the second and fifth rows are connected to wires 32 formed by the first metal layer 15*a*, which is different from the metal layer by which those terminals 31 are formed. Therefore, the terminals 31 of the second and fifth rows have connectors 31*b*. The terminals 31 of the third and sixth rows are connected to wires 32 formed by the third metal layer 15*c*, which is different from the metal layer by which those terminals 31 are formed. Therefore, the terminals 31 of the third and sixth rows have connectors 31*c*.

In the active matrix substrate 10 according to the third embodiment, as in the active matrix substrate 10 according to the first embodiment (FIG. 7), the second insulating film 11*b* has contact holes 62 in positions on the wires 32 connected to the connectors 31*b* of the terminals 31 of the second and fifth rows, with the positions corresponding to the connectors 31*b* and covering the upper sides of the wires 32 (FIG. 12). Furthermore, in the active matrix substrate 10 according to the third embodiment, the fifth insulating film 12*a* and the sixth insulating film 12*b* have contact holes 62A and 62B, respectively, in positions on the wires 32 connected to the connectors 31*b*, with the positions corresponding to the connectors 31*b* and covering the upper sides of the wires 32 (FIG. 12).

The contact holes 62, 62A, and 62B communicate with one another. The contact holes 62, 62A, and 62B are provided in communication between the second metal layer 15*b*, by which the terminals 31*a* are formed, and the first metal layer 15*a*, by which the wires 32 connected to the connectors 31*b* are formed. This causes the wires 32 to be partially exposed upward. The contact holes 62, 62A, and 62B are formed en bloc in the second insulating film 11*b*, the fifth insulating film 12*a*, and the sixth insulating film 12*b* in the step of patterning the sixth insulating film 12*b*.

The connectors 31*b* are formed by the second metal layer 15*b* to cover parts of the second insulating film 11*b* and the contact holes 62, 62A, and 62B. This causes the connectors 31*b* to make contact with parts of the wires 32 thus exposed and be electrically connected to the wires 32. In other words, the terminals 31 of the second and fifth rows and the wires 32 formed by the first metal layer 15*a* are connected to each other via the contact holes 62, 62A, and 62B.

Further, the sixth insulating film 12*b* has the contact holes 62B in positions covering the upper sides of wires 32 connected to the connectors 31*c* (FIG. 13). The contact holes 62B are formed in communication between the second metal layer 15*b*, by which the terminals 31 are formed, and the third metal layer 15*c*, by which the wires 32 connected to the connectors 31*c* are formed. This causes the wires 32 to be partially exposed upward. The contact holes 62B are formed in the step of patterning the sixth insulating film 12*b*.

The connectors 31*c* are formed by the second metal layer 15*b* to cover parts of the sixth insulating film 12*b* and the contact holes 62B. This causes the connectors 31*c* to make contact with parts of the wires 32 thus exposed and be electrically connected to the wires 32. In other words, the terminals 31 of the third and sixth rows and the wires 32 formed by the third metal layer 15*c* are connected to each other via the contact holes 62B.

Although, in the active matrix substrate 10 according to the third embodiment, three metal layers are stacked with insulating films sandwiched therebetween, there may be three or more metal layers. In the active matrix substrate 10 according to the third embodiment, the wires 32A and 32E, which are adjacent to the terminal 31A in planar view, are formed by a metal layer that is different from that by which the terminal 31A is formed, and the wires 32B and 32D, which are adjacent to the wires 32A and 32E, respectively, in planar view, are formed by a further different metal layer. Such a configuration allows wires 32 adjacent to each other in each metal layer to be placed at a spacing greater than or equal to the patternable distance H1, and allows wires 32 formed by different metal layers and adjacent to each other in planar view to be placed at a spacing smaller the distance H1. This results in making it possible to place the terminals 31 in a larger number of rows while make the placement of the wires 32 easy without reducing the widths of the terminals 31.

Fourth Embodiment

Figure 14:
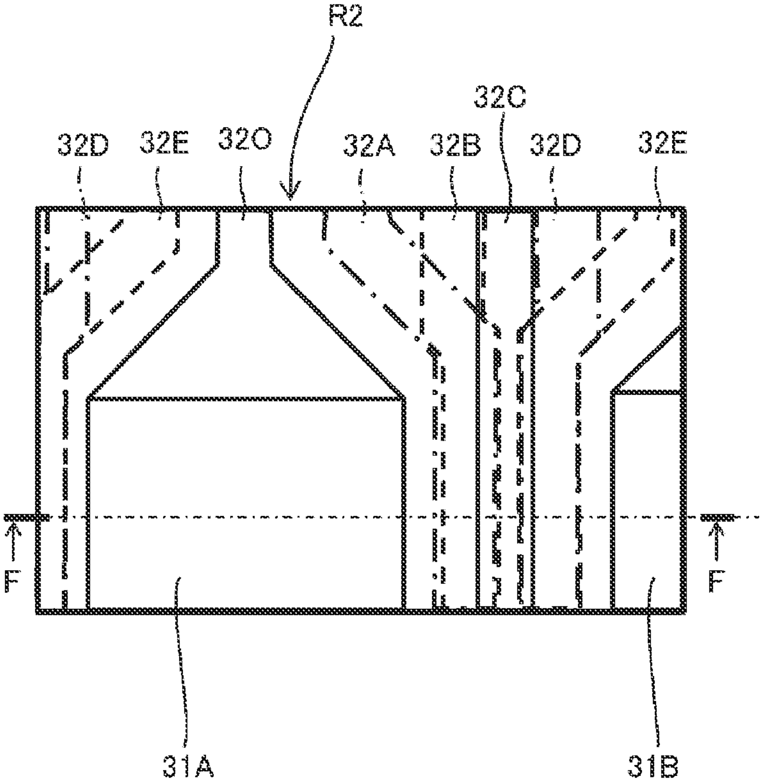
FIG. 14 is a schematic enlarged view of a portion R2 of an active matrix substrate according to a fourth embodiment that is equivalent to the portion R of FIG. 10.
Figure 15:
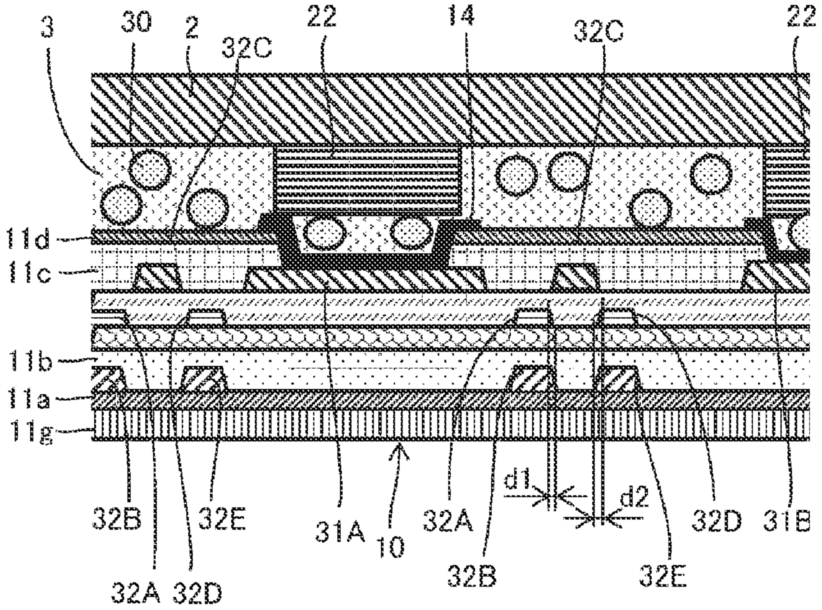
FIG. 15 is a schematic cross-sectional view of the portion R2 as taken along line F-F in FIG. 14.

In the stacking of three or more metal layers and the formation of wires 32 by different metal layers, adjacent wires 32 may be disposed to at least partially overlap each other in planar view as in the active matrix substrates 10 (FIGS. 5, 6, and 9) according to the first and second embodiments. FIG. 14 is a schematic enlarged view of a portion R2 of an active matrix substrate 10 according to a fourth embodiment that is equivalent to the portion R of FIG. 10. FIG. 15 is a schematic cross-sectional view of the portion R2 as taken along line F-F.

In the active matrix substrate 10 according to the fourth embodiment as compared with the active matrix substrate 10 according to the third embodiment (FIG. 11), the wires 32B and 32E, which are adjacent to each other in planar view and formed by the first metal layer 15*a*, and the wires 32A and 32D, which are formed by the third metal layer 15*c*, are disposed to overlap each other by lengths d1 and d2, respectively, in planar view.

This makes it possible to, even with a smaller spacing between the terminals 31A and 31B than in the active matrix substrate 10 according to the third embodiment, secure the number of wires that are placed. This results in making it possible to place the terminals 31 in a larger number of rows than in the active matrix substrate 10 according to the third embodiment.

Further, since the wires 32B and 32E and the wires 32A and 32D are disposed to overlap each other in planar view, the spacings between the terminals 31A and 31B and wires 32C formed by the second metal layer 15*b*, which is identical to the metal layer by which the terminals 31A and 31B are formed, are secured. This makes it possible to increase the distances from fitted bumps 22 to the wires 32C. This results in making it possible to stop the bumps 22 and the wires 32C from becoming short-circuited even in a case where the bumps 22 are misaligned with the terminals 31A and 31B.

Modification 1

Although each of the active matrix substrates 10 according to the first and second embodiments includes two metal layers, namely the first metal layer 15*a* and the second metal layer 15*b*, the number of metal layers that the active matrix substrate 10 includes is not limited to 2. The active matrix substrate 10 may include three or more metal layers one or another of which is the first metal layer 15*a* or the second metal layer 15*b*.

In each of the active matrix substrates 10 according to the first and second embodiments, the wires 32A, 32B, 32C, 32D, and 32E, which are placed between the terminals 31A and 31B, are alternately formed by the first metal layer 15*a* or the second metal layer 15*b* in sequence in planar view. In a case where each of the active matrix substrates 10 according to the first and second embodiments includes three or more metal layers, the wires 32A, 32B, 32C, 32D, and 32E are not limited to being alternately formed by the first metal layer 15*a* or the second metal layer 15*b*. As another example, the wires 32A, 32B, 32C, 32D, and 32E may be alternately formed by the second metal layer 15*b* and a metal layer that is not adjacent to the second metal layer 15*b* in an overlap direction.

In this case, connection to each wire 32 is allowed by providing all terminals 31 formed by the second metal layer 15*b* with connectors 31*a* and contact holes 62.

Modification 2

Although the foregoing description assumes that the display panel 100 is a liquid crystal panel, the liquid crystal panel is just one example, and the display panel 100 may be another type of display panel, provided the display panel has a driving IC 2 mounted on a driving substrate. As another example, the display panel 100 may be an organic EL (electroluminescence) display including OLEDs (organic light-emitting diodes).

Modification 3

Although, in the foregoing examples, the terminals 31 are formed by an identical metal layer (second metal layer 15*b*), a plurality of terminals 31 may be formed by two or more metal layers. For example, a terminal 31A formed by the second metal layer 15*b* and a terminal 31B formed by the first metal layer 15*a* may be stacked. This makes it possible to reduce the numbers of connectors and contact holes via which the terminals 31 and the wires 32 are connected to each other.

Modification 4

In the foregoing description, as one example, the plurality of terminals 31 are formed in a six-row staggered arrangement in the terminal region E3. This allows the plurality of terminals 31 to be connected to the driving IC 2, in which the bumps 22 are placed in a six-row staggered arrangement in a longitudinal direction. The number of rows in which the plurality of terminals 31 are arranged in the active matrix substrate 10 is not limited to 6, and the plurality of terminals 31 need only be arranged in multiple rows. That is, the number of rows in which the plurality of terminals 31 are arranged in the active matrix substrate 10 may be smaller than or equal to 5 or may be larger than or equal to 7.

3. Additional Statement

The present disclosure is not limited to the aforementioned embodiments but may be variously modified.

The present disclosure contains subject matter related to that disclosed in Japanese Priority Patent Application JP 2023-103677 filed in the Japan Patent Office on Jun. 23, 2023, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A driving substrate of a display panel, the driving substrate comprising:

a pixel element;

a plurality of terminals, formed by at least one metal layer and placed outside a pixel region in which the pixel element is placed, that are connected separately to each of a plurality of output signal bumps of a driving circuit; and a plurality of output signal wires extending separately from each of the plurality of terminals to the pixel region, wherein the plurality of output signal wires are placed between adjacent two of the plurality of terminals in planar view, the plurality of output signal wires placed between the adjacent two terminals include two or more output signal wires formed by two or more layers, and the two or more output signal wires are disposed to at least partially overlap each other in planar view.

2. The driving substrate according to claim 1, further comprising a plurality of gate lines and a plurality of source lines disposed to intersect each other in planar view, wherein the pixel element is placed at a point of intersection of each of the gate lines and each of the source lines, and the output signal wires separately connect each of the terminals to any of the plurality of gate lines and the plurality of source lines.

3. The driving substrate according to claim 2, wherein the two or more layers include a gate layer by which the gate lines are formed and a source layer by which the source lines are formed.

4. The driving substrate according to claim 1, wherein the two or more layers include a layer by which the terminals are formed, the two or more output signal wires include a first output signal wire placed adjacent to the terminals in planar view, and the first output signal wire is formed by a layer different from the layer by which the terminals are formed.

5. The driving substrate according to claim 4, wherein the two or more output signal wires further include a second output signal wire placed adjacent to the terminals in the layer by which the terminals are formed, and the second output signal wire is disposed to at least partially overlap the first output signal wire in planar view.

6. The driving substrate according to claim 1, wherein the two or more layers include a first layer different from a layer by which the terminals are formed, and the terminals and the output signal wires formed by the first layer are connected to each other via contact holes provided in communication between the layer by which the terminals are formed and the first layer.

7. The driving substrate according to claim 1, further comprising an insulating film disposed to cover a layer by which the terminals are formed, wherein the terminals are connected via contact holes provided in the insulating films to electrodes that are connected to the output signal bumps.

8. A display panel comprising the driving substrate according to claim 1.

* * * * *